(12) United States Patent
Kim

(10) Patent No.: US 12,207,493 B2
(45) Date of Patent: Jan. 21, 2025

(54) ENCAPSULATION MATERIAL FOR LIGHT-EMITTING ELEMENT AND LIGHT-EMITTING DEVICE MANUFACTURED USING THE SAME

(71) Applicant: Electronics and Telecommunications Research Institute, Daejeon (KR)

(72) Inventor: Gi Heon Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 243 days.

(21) Appl. No.: 17/879,348

(22) Filed: Aug. 2, 2022

(65) Prior Publication Data

US 2023/0124280 A1    Apr. 20, 2023

(30) Foreign Application Priority Data

Oct. 20, 2021 (KR) .......................... 10-2021-0140455

(51) Int. Cl.
*H10K 50/84* (2023.01)
*H10K 50/842* (2023.01)
*H10K 71/00* (2023.01)

(52) U.S. Cl.
CPC ....... *H10K 50/846* (2023.02); *H10K 50/8426* (2023.02); *H10K 71/00* (2023.02)

(58) Field of Classification Search
CPC ... H10K 50/846; H10K 50/8426; H10K 71/00
See application file for complete search history.

(56) References Cited

U.S. PATENT DOCUMENTS

| | | | |
|---|---|---|---|
| 6,926,572 B2 | 8/2005 | Park et al. | |
| 7,061,012 B2 | 6/2006 | Kim et al. | |
| 2014/0191445 A1* | 7/2014 | Rist | B29C 35/0888 |
| | | | 264/496 |

FOREIGN PATENT DOCUMENTS

| | | |
|---|---|---|
| KR | 10-2003-0082257 A | 10/2003 |
| KR | 10-2005-0006558 A | 1/2005 |
| KR | 10-2014-0054058 A | 5/2014 |
| KR | 10-2014-0093213 A | 7/2014 |
| KR | 10-2016-0143799 A | 12/2016 |
| KR | 10-2019-0012186 A | 2/2019 |
| KR | 10-1984581 B1 | 6/2019 |

* cited by examiner

*Primary Examiner* — Anne M Hines
(74) *Attorney, Agent, or Firm* — NSIP Law

(57) ABSTRACT

Encapsulation materials for light-emitting elements such as organic light-emitting diodes and polymer light-emitting diodes are implemented as a photopolymerizable hydrophobic fluid dispersion polymer having both adhesive and barrier properties. A light-emitting element encapsulation is formed by applying the photopolymerizable hydrophobic fluid dispersion polymer of the present invention to a manufactured light-emitting element and photocuring. An encapsulation structure may be formed in a short time through a simple coating (or filling) process and a curing process by exposure (UV, or the like), and thus an encapsulation of a light-emitting device (particularly, a large-area organic light-emitting diode) is possible at low cost without using expensive deposition equipment.

17 Claims, 2 Drawing Sheets

ENCAPSULATION MATERIAL FOR LIGHT-EMITTING ELEMENT AND LIGHT-EMITTING DEVICE MANUFACTURED USING THE SAME

CROSS-REFERENCE TO RELATED APPLICATION

This application claims priority to and the benefit of Korean Patent Application No. 10-2021-0140455, filed on Oct. 20, 2021, the disclosure of which is incorporated herein by reference in its entirety.

BACKGROUND

1. Field of the Invention

The present invention relates to an encapsulation material for enhancing the lifespan of a light-emitting element, and more particularly, to a material composition for encapsulation of an organic light-emitting diode (OLED), and a light-emitting device manufactured using the same.

2. Discussion of Related Art

A light-emitting element, in particular, an organic light-emitting diode (OLED) is generally formed on an anode electrode on either a flexible or a rigid substrate, and includes a hole transport layer configured to inject holes as an organic light-emitting layer, an organic light-emitting layer formed on the hole transport layer, an electron injection layer formed on the organic light-emitting layer and configured to inject electrons into the organic light-emitting layer, and a cathode electrode connected to the electron injection layer.

This organic light-emitting diode has excellent characteristics such as a wide viewing angle, a quick response time, high contrast, high luminous efficiency, and no need for a separate light source. However, the organic light-emitting diode has disadvantages that it has a shorter lifespan than conventional LCDs and it is difficult to achieve color balance because the lifespans of elements representing red, green, and blue are different.

The organic light-emitting diode has a disadvantage that it is very vulnerable to moisture and oxygen, and the characteristics of electrode materials degrade due to oxidation, so that the lifespan of the element is rapidly reduced. In order to overcome these disadvantages and secure the stability and reliability of the organic light-emitting diode, various attempts and technologies have been researched and developed, and one of them is an encapsulation method using a glass lid or a metal lid.

In a currently widely used method, first, a metal lid or a glass lid is washed and dried, and then a moisture absorbent (mainly, calcium oxide or barium oxide is used) is attached to the inside of the lid. Thereafter, the lid is attached to a substrate on which the organic light-emitting diode is formed using a UV-curable adhesive in an inert gas atmosphere to encapsulate the organic light-emitting diode.

In the case of such an encapsulation method, it becomes a burden on a weight reduction of an element due to the use of a glass lid or a metal lid, and it is difficult to encapsulate an organic light-emitting diode having a large-area. In addition, the aforementioned encapsulation method requires a relatively long process time, and there is a difficulty in thinning the element. In addition, since an organic light-emitting diode to which a glass lid or a metal lid is attached cannot be bent, there is a disadvantage in that its application is limited.

In order to compensate for the disadvantages of the encapsulation method using a metal lid or a glass lid, a method of encapsulating by attaching a multi-layer plastic film using an adhesive layer and a method of encapsulating an inorganic film using physical vacuum deposition or chemical vacuum deposition have been proposed. However, these methods have a disadvantage that expensive equipment (physical/chemical vacuum chamber, vacuum pump, etc.) must be used, and there are problems in stability and reliability because an adhesive interface exists separately. In addition, a method of forming an encapsulation thin film by applying a siloxane-based monomer to an organic light-emitting diode by various methods such as spin coating or deep coating and then polymerizing the same by using light or heat, has been proposed. However, securing reliability through this method is difficult, the process is complicated, and there is a problem with productivity.

SUMMARY OF THE INVENTION

In order to solve the aforementioned problems of the related art, proposed are an encapsulation material capable of protecting a light-emitting element such as an OLED, and performing an encapsulation preventing penetration of moisture or oxygen in a simple method and at low cost through the present invention and a light-emitting device manufactured using the same.

In order to achieve the aforementioned object, an encapsulation material for a light-emitting element (an organic light-emitting diode, a polymer light-emitting diode, etc.) according to one aspect of the present invention is implemented as a photopolymerizable hydrophobic fluid dispersion polymer having adhesive and barrier properties at the same time.

A light-emitting element is formed by sequentially forming an anode, a hole transport layer, a light-emitting layer (low molecule or polymer), an electron transport layer, and an electron transport electrode on a transparent substrate such as glass or plastic, and an encapsulation is performed by applying the photopolymerizable hydrophobic fluid dispersion polymer of the present invention to the light-emitting element and then photocuring.

The photopolymerizable hydrophobic fluid dispersion polymer, which is a light-emitting element encapsulation material according to the present invention, includes a photocurable polymer precursor, a hydrophobic fluid, and a photoinitiator. Additionally, a moisture absorbent may be included in the photopolymerizable hydrophobic fluid dispersion polymer to absorb moisture and oxygen in the atmosphere.

Since the photopolymerizable hydrophobic fluid dispersion polymer, which is an encapsulation material according to the present invention, is a composition capable of forming an encapsulation structure in a short time through a simple coating (or filling) process and a curing process by exposure (ultraviolet rays (UV), or the like) to a light-emitting element, it is possible to encapsulate a light-emitting element, in particular, a light-emitting element of a large-area at low cost without using expensive deposition equipment.

In addition, since the photopolymerizable hydrophobic fluid dispersion polymer, which is an encapsulation material according to the present invention, includes a hydrophobic fluid having a water-repellent properties and blocking performance to oxygen for moisture, and a polymer having an adhesion, penetration of moisture or oxygen causing degradation of a light-emitting element can be effectively prevented as a thin form, and moreover, it is possible to improve the lifespan or commercial value of a light-emitting device as a thin form by adhering to structures having various shapes, or by adhering a light-emitting element to a separately manufactured organic/inorganic composite layer, or a film or thin glass on which an inorganic layer is formed.

In addition, the photopolymerizable hydrophobic fluid dispersion polymer, which is an encapsulation material according to the present invention, has good transparency. Therefore, it is suitable for manufacturing a top-emission type light-emitting device.

On the other hand, according to another aspect of the present invention, there is provided a light-emitting device including an encapsulation formed by applying an encapsulation material for a light-emitting element including the aforementioned hydrophobic fluid, a photocuring polymer precursor configured to immobilize the hydrophobic fluid after a curing reaction by light, and a photoinitiator configured to improve a curing rate of the photocuring polymer precursor during photocuring to a light-emitting element and photocuring.

To form an encapsulation, the aforementioned encapsulation material may be applied to a light-emitting element in a simple manner, for example, a spin coating method, a bar coating method, a spreading coating method, or a simple immersion method, and then photocured. Alternatively, the aforementioned encapsulation material may be applied to a medium and photocured, and then the medium may be adhered to a light-emitting element to form an encapsulation.

The configurations and operations of the present invention will become more apparent from exemplary embodiments described in detail below with reference to the drawings.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Advantages and features of the present invention and methods for achieving them will be made clear from embodiments described in detail below with reference to the accompanying drawings. However, the present invention may be embodied in many different forms and should not be construed as being limited to the embodiments set forth herein. Rather, these embodiments are provided so that this disclosure will be thorough and complete and will fully convey the scope of the present invention to those of ordinary skill in the technical field to which the present invention pertains and the present invention is defined by the claims. In addition, terms used herein are for the purpose of describing the embodiments and are not intended to limit the present invention. As used herein, the singular forms include the plural forms as well unless the context clearly indicates otherwise. In addition, the term "comprise" or "comprising" used herein does not preclude the presence or addition of one or more other elements, steps, operations, and/or devices other than stated elements, steps, operations, and/or devices.

Hereinafter, the most preferred embodiment of the present invention will be described with reference to the accompanying drawings in order to easily implement the technical idea of the present invention by those skilled in the art. Although the encapsulation of an organic light-emitting diode is described below, it is apparent to those skilled in the art that an encapsulation material of the present invention may be applied to a light-emitting element other than an organic light-emitting diode.

Figure 1:
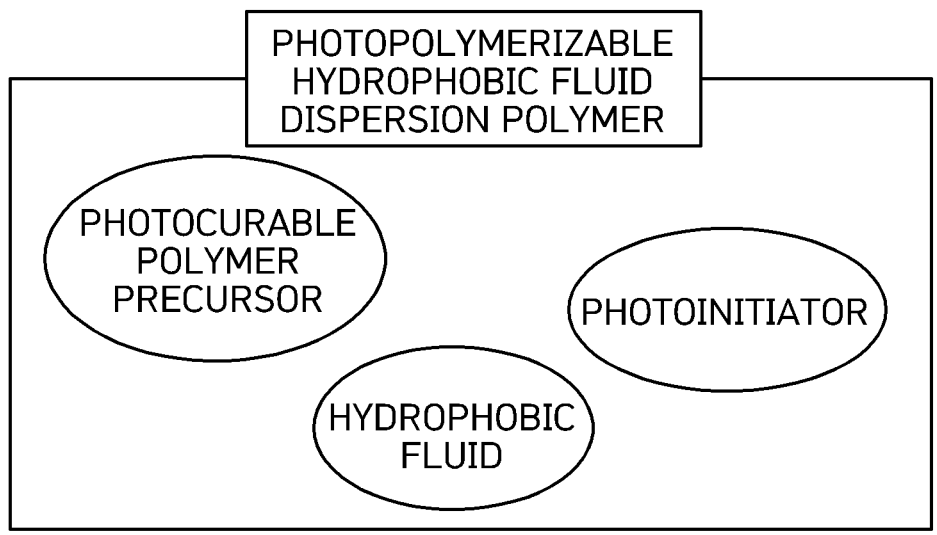
FIG. 1 shows a configuration of one exemplary embodiment of a light-emitting element encapsulation material according to the present invention.

FIG. 1 shows a configuration of one exemplary embodiment of a light-emitting element encapsulation material according to the present invention. The light-emitting element encapsulation material is a photopolymerizable hydrophobic fluid dispersion polymer, and may include photocurable (for example, UV-curable) polymer precursor, hydrophobic fluid, and photoinitiator, as shown in FIG. 1. Here, the hydrophobic fluid may be a fluid composed of oil, solvent, polymer, or the like.

Figure 2:
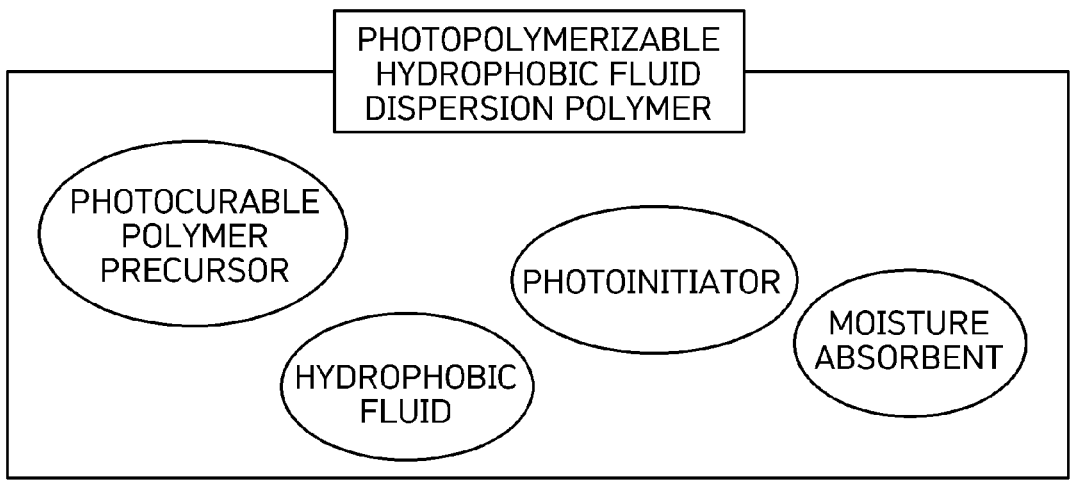
FIG. 2 shows a configuration of another exemplary embodiment of a light-emitting element encapsulation material according to the present invention.

FIG. 2 shows a configuration of another exemplary embodiment of a light-emitting element encapsulation material. In the case of this exemplary embodiment, a photopolymerizable hydrophobic fluid dispersion polymer which is an encapsulation material may include UV-curable polymer precursor, hydrophobic fluid, photoinitiator, and moisture absorbent. Here, the moisture absorbent is configured to absorb moisture or oxygen in the atmosphere, and may include at least one selected from calcium, silica gel, zeolite, and alkali metals.

Figure 3:
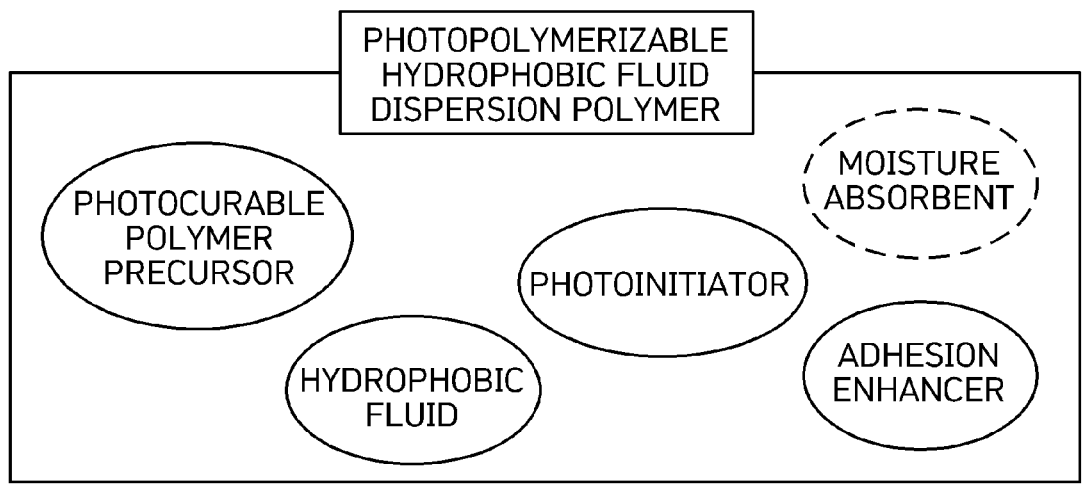
FIG. 3 shows a configuration of still another exemplary embodiment of a light-emitting element encapsulation material according to the present invention.

FIG. 3 shows a configuration of still another exemplary embodiment of a light-emitting element encapsulation material. In this exemplary embodiment, in addition to the exemplary embodiments in FIG. 1 and/or FIG. 2, an adhesive force is strengthened on an outer surface of a light-emitting device manufactured by encapsulating a polymer cured by immobilizing a hydrophobic fluid with the aforementioned encapsulation material, and in order to adhere various structures to the outer surface or to adhere a separately manufactured encapsulation film or a thin glass substrate, an adhesion enhancer which may be one of acrylate oligomers, urethane-acrylate oligomers, epoxy oligomers, and epoxy-acrylate oligomers, is included in the aforementioned polymer precursor. Here, the molecular weight of the oligomer may be 500 to 50000.

After applying the photopolymerizable hydrophobic fluid dispersion polymer configured as described above to a light-emitting element, an encapsulation operation is completed by curing with light (hereinafter, exemplified by ultraviolet rays (UV)). During UV-curing, light having a wavelength of 250 to 400 nm is used, and photocuring energy of 30 to 2000 mJ is applied in consideration of the light stability of a light-emitting element.

Hereinafter, each of the aforementioned constituent elements of the photopolymerizable hydrophobic fluid dispersion polymer, which is an encapsulation material according to the present invention, will be described in detail as follows.

<Photocurable polymer precursor>

A reactive precursor for immobilizing a hydrophobic fluid after a curing reaction by light (e.g., UV) may include at least one material selected from the following reactants.

acrylic-based: 1,6-hexanediol diacrylate (HAD), 2-hydroxyethyl methacrylate (2-HEMA), 2-ethylhexyl acrylate, hydroxyethyl acrylate (HEA), methyl methacrylate (MMA), methacrylate (MA), isobornyl acrylate (IOBA), 2 (2-ethoxyethoxy) ethyl acrylate (EOEOEA), triethylopropane triacrylate (TMPTA), trimethylolpropane diallyl ether (TMPDE), tri (propylene glycol) diacrylate (TPGDA), pentaerythritol triacrylate (PETA), ethylene glycol dimethacrylate (EGDA), triethyropropane trimethacrylate (TMPTMA), 2-phenoxyethyl acrylate (2-PEA), trimethylolpropane ethoxylate triacrylate (TMPEOTA), tetrahydrofurfuryl acrylate (THFA), urethane diacrylate.

aromatic-based: styrene (ST), divinyl benzene (DVB)

acrylonitrile-based (AN-based): acrylonitrile (AN)

chloride-based (Cl-based): vinylidene chloride (VDC), vinylbenzyl chloride (VBC)

others: vinyl stearate (VS), vinyl propionate (VP)

<Hydrophobic Fluid>

As a hydrophobic fluid, a material having high thermal conductivity, excellent barrier properties against moisture or oxygen, and a denser shape compared to polymers, which acts as a barrier and has good exothermic properties, is used. The hydrophobic fluid applied to the encapsulation material of the present invention may have a water contact angle of 90° or more. The following materials may be used as the hydrophobic fluid:

At least one material selected from amorphous fluoropolymer, liquid containing fluorine, halocarbon oil, polyphenyl-methyl siloxane containing siloxane groups, polydiphenyl siloxane, polydimethyl siloxane, silicone oil, paraffin oil, mineral oil, almond oil, corn oil, cottonseed oil, linseed oil, tung oil, castor oil, cinnamon oil or coconut oil, an amorphous fluorine-based fluid such as, tetrafluoroethylene, trifluoroethylene, difluoroethylene, 2,2-bisfluoromethyl-4,5-difluoro-1,3-dixole, or chlorotrifluoroethylene, an isoparaffinic hydrocarbon solvent, and liquid crystal having a C3 or higher alkyl chain.

In the photopolymerizable hydrophobic fluid dispersion polymer according to the present invention, the amount of the hydrophobic fluid may be 30 to 180 parts by weight based on 100 parts by weight of the UV-curable polymer precursor.

<UV Curing Agent>

In order to improve a curing rate of the precursor during photo (UV) curing, one or more photoinitiators may be mixed with a UV curable polymer composition according to the present invention. In this case, the photoinitiator may be included in an amount of 0.3 to 5 parts by weight based on 100 parts by weight of the UV curable polymer precursor.

The following materials may be used as photoinitiators for UV curing:

At least one material selected from benzophenone, 1-hydroxy-cyclohexyl-phenyl-ketone (Irgacure 907), JR Cure, 2-methyl-1 [4-(methylthio)phenyl]-2-morpholinopropane-1-one (Irgacure 184C), 2-hydroxy-2-methyl-1-phenyl-propane-1-one (Darocur 1173), an initiator (Irgacure 500) in which 50 wt % of Irgacure 184C and 50 wt % of benzophenone are mixed, an initiator (Irgacure 1000) in which 20 wt % of Irgacure 184 and 80 wt % of Irgacure 1173 are mixed, 2-hydroxy-1-[4-(2-hydroxyethoxy)phenyl]-2-methyl-1propanone (Irgacure 2959), methylbenzoylformate (Darocur MBF), alpha, alpha-dimethoxy-alpha-phenylacetophenone (Irgacure 651), 2-benzyl-2-(dimethylamino)-1-[4-(morpholinyl)phenyl]-1-butanone (Irgacure 369), an initiator (Irgacure 1300) in which 30 wt % of Irgacure 369 and 70 wt % of Iragacure 651 are mixed, diphenyl(2,4,6-trimethylbenzoyl)-phosphine oxide (Darocur TPO), an initiator (Darocur 4265) in which 50 wt % of Darocur TPO and 50 wt % of Darocure 1173 are mixed, phosphine oxide, phenyl bis(2,4,6-trimethyl benzoyl(Irgacure 819), 2-hydroxy-2-methyl-1-phenyl-propane-1-one (Darocur 1173), an initiator (Irgacure 2005) in which 5 wt % of Iragacure 819 and 95 wt % of Darocure 1173 are mixed, an initiator (Irgacure 2010) in which 10 wt % of Irgacure 819 and 90 wt % of Darocure 1173 are mixed, an initiator (Irgacure 2020) in which 20 wt % of Irgacure 819 and 80 wt % of Darocure 1173 are mixed, bis(.eta.5-2,4-cyclopentadien-1-yl) bis [2,6-difluoro-3-(1h-pyrrol-1-yl)phenyl] titanium (Irgacure 784), a benzophenone-containing mixed initiator (HSP 188), 1-hydroxy-cyclohexylphenyl-ketone (CPA), and 2,4,6,-trimethylbenzoyl-diphenyl-phosphineoxide (Darocur TPO).

As described above, since materials used in the present invention basically show a liquid phase, the process of applying the liquid phase hydrophobic fluid and the reactive precursor presented in the present invention may be expressed as a wet process (coating and curing using a liquid phase).

Figure 4:
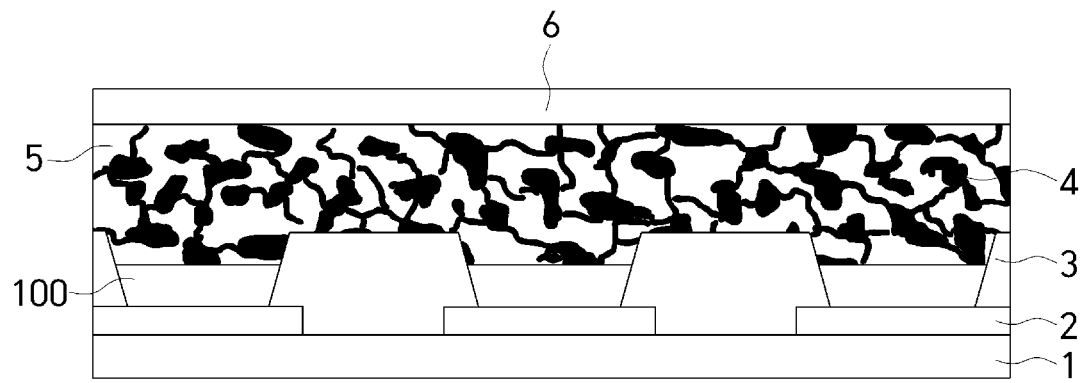
FIG. 4 is a cross-sectional view of one exemplary embodiment of an organic light-emitting diode encapsulated by applying an encapsulation material of the present invention.

FIG. 4 is a cross-sectional view of a light-emitting device (an organic light-emitting diode) encapsulated by applying an encapsulation material according to the present invention, that is, a photopolymerizable hydrophobic fluid dispersion polymer.

Referring to FIG. 4, since an organic light-emitting diode 100 is formed on a substrate 1 made of transparent glass or plastic material, the organic light-emitting diode has a stacked structure on which an anode 2 such as indium tin oxide (ITO) formed on the substrate 1, a hole transport layer formed on the anode 2 to inject holes into a light-emitting layer, a light-emitting layer formed on the hole transport layer, an electron transport layer formed on the light-emitting layer to inject electrons, and a metal electrode for a cathode formed on the electron transport layer are sequentially stacked. In addition, a pixel defining layer (PDL) 3 configured to divide a pixel boundary of the OLED is formed.

As one method for encapsulating an organic light-emitting diode having such a multi-layered structure, an encapsulated light-emitting device may be manufactured by directly applying an encapsulation material based on the photopolymerizable hydrophobic fluid dispersion polymer according to this invention onto an organic light-emitting diode by a spin coating method, a bar coating method, a spreading coating method, a simple immersion method, or the like and then photopolymerizing the encapsulated resultant.

Meanwhile, as another method for manufacturing an encapsulated light-emitting device, the photopolymerizable hydrophobic fluid dispersion polymer of the present invention may be coated and cured on a medium such as an encapsulation film or a thin glass substrate, and then adhered to the outer surface of an organic light-emitting diode.

When a polymer reaction proceeds in a hydrophobic fluid dispersion composition 5, which is an encapsulation material of the present invention, by light, as phase separation of a hydrophobic fluid and a polymer occurs, a hydrophobic fluid structure of a network structure 4 is formed. The network structure 4 of the hydrophobic fluid formed at this time may show a difference depending on a polymer/hydrophobic fluid ratio, a curing reaction rate, a reaction temperature, a type of hydrophobic fluid, and a structure of the polymer.

Subsequently, a second support substrate 6, which is a barrier layer for enhancing the lifespan and durability of the organic light-emitting diode 100, is adhered using a hydrophobic fluid dispersion adhesive layer (that is, a layer in which the network structure 4 of the hydrophobic fluid is formed). In order to strengthen the adhesive force at this time, as mentioned above, an adhesion enhancer may be additionally included in the photopolymerizable hydrophobic fluid dispersion polymer. The second support substrate 6 may include a thin glass or a film in which a polymer (plastic) and inorganic materials (SiC, SiN, SiO, $Al_2O_3$, AlN, SiON) are stacked, or a multilayer film made of only inorganic films.

Figure 5:
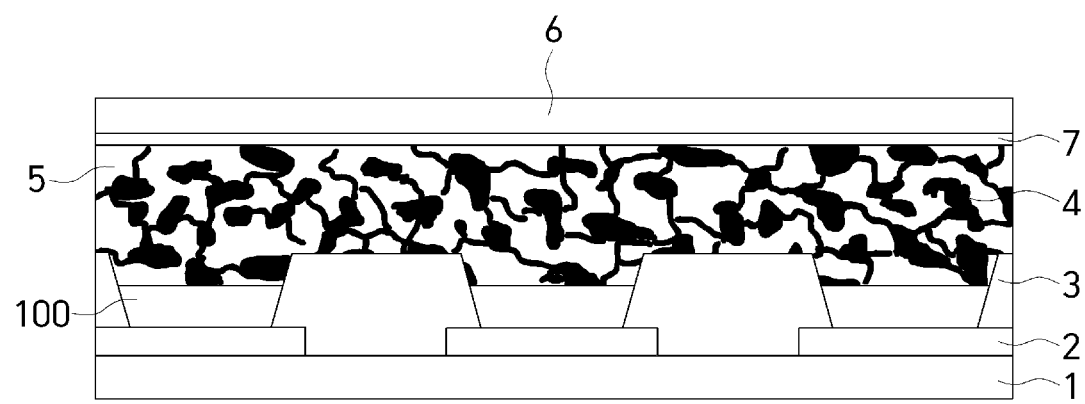
FIG. 5 is a cross-sectional view of another exemplary embodiment of an organic light-emitting diode encapsulated by applying an encapsulation material of the present invention.

Meanwhile, an encapsulated light-emitting device according to another exemplary embodiment may include structures (iron, plastic, ceramic, etc.) of various shapes instead of the second support substrate 6. In an encapsulated light-emitting device according to still another exemplary embodiment, a moisture absorbing layer is formed between a second support substrate (organic/inorganic multilayer) and a hydrophobic fluid dispersion adhesive layer 4 to enhance the hygroscopicity of an organic light-emitting diode (refer to FIG. 5).

As described above, according to the encapsulation of the light-emitting element using the photopolymerizable hydrophobic fluid dispersion polymer according to the present invention, a high-quality barrier having a desired shape may be formed in a short time at low production cost without using expensive equipment, and the permeation of moisture or oxygen causing element degradation may be effectively blocked. In addition, the light-emitting device manufactured by this method is bendable, may be stacked on structures of various shapes, and has the advantage of being easy to manufacture with a large-area (large-area).

In addition, compared to the method of attaching an encapsulation film using an existing adhesive, when a film containing a hydrophobic fluid is formed together on an adhesive layer and then adhered, mechanical reliability and stability of a flexible organic light-emitting diode may be improved.

The following effect can be obtained by performing a light-emitting element encapsulation using a light-emitting element encapsulation material according to the present invention.

First, in the past, when a second encapsulation film or a glass substrate is adhered to an upper part of a flexible light-emitting element with only an adhesive, there has been a problem of reliability and stability degradation due to an adhesive layer, but by applying an adhesive layer in which a hydrophobic fluid is immobilized on a polymer by the present invention to an encapsulation, a low-cost, light-weight, and large-area encapsulated light-emitting element compared to a conventional light-emitting element can be obtained.

Second, compared to an encapsulation process using vacuum deposition, separate expensive equipment (physical/chemical vacuum chamber, vacuum pump, etc.) is not required, and by applying an adhesive layer in which a hydrophobic fluid is immobilized on a polymer, a light-emitting element encapsulation structure can be obtained easily and inexpensively. This has an excellent effect in terms of economy, processability, reliability of work, and the like, compared to a conventional vacuum deposition method.

Third, due to the structure of an encapsulation result according to the present invention, it is particularly useful in the manufacturing of organic light-emitting diodes having a large-area and can be applied to a bendable display.

Fourth, the lifespan of a light-emitting element can be enhanced by adding a moisture absorbent (calcium, silica gel, zeolite, alkali metals, etc.) to an adhesive layer in which a hydrophobic fluid is immobilized on a polymer, or by interposing a moisture absorbing layer between the adhesive layer and a barrier.

Although the present invention has been described in detail through preferred embodiments of the present invention, those of ordinary skill in the technical field to which the present invention pertains should be able to understand that various modifications and alterations can be made without departing from the technical spirit or essential features of the present invention. Therefore, it should be understood that the disclosed embodiments are not limiting but illustrative in all aspects. In addition, the scope of the present invention is defined not by the above description but by the following claims, and it should be understood that all changes or modifications derived from the scope and equivalents of the claims fall within the scope of the present invention.

What is claimed is:

1. An encapsulation material for a light-emitting element, comprising:
    a hydrophobic fluid;
    a photocurable polymer precursor configured to immobilize the hydrophobic fluid after a curing reaction by light;
    a photoinitiator configured to improve a curing rate of the photocurable polymer precursor during photocuring, and
    a moisture absorbent configured to absorb at least one of moisture and oxygen in an atmosphere.

2. The encapsulation material of claim 1, wherein the hydrophobic fluid is included in an amount of 30 to 180 parts by weight based on 100 parts by weight of the photocurable polymer precursor.

3. The encapsulation material of claim 1, wherein the photoinitiator is included in an amount of 0.3 to 5 parts by weight based on 100 parts by weight of the photocurable polymer precursor.

4. The encapsulation material of claim 1, wherein the moisture absorbent includes at least one selected from calcium, silica gel, zeolite, and alkali metals.

5. The encapsulation material of claim 1, further comprising an adhesion enhancer configured to strengthen an adhesive force of the polymer cured by immobilizing the hydrophobic fluid.

6. The encapsulation material of claim 5, wherein the adhesion enhancer includes at least one selected from an acrylate oligomer, a urethane-acrylate oligomer, an epoxy oligomer, and an epoxy-acrylate oligomer.

7. The encapsulation material of claim 1, wherein the photocurable polymer precursor includes one or more materials selected from, acrylic-based: 1,6-hexandiol diacrylate (HAD), 2-hydroxyethyl methacrylate (2-HEMA), 2-ethylhexyl acrylate, hydroxyethyl acrylate (HEA), methyl methacrylate (MMA), methacrylate (MA), isobornyl acrylate (IOBA), 2 (2-ethoxyethoxy) ethyl acrylate (EOEOEA), triethylopropane triacrylate (TMPTA), trimethylolpropane diallyl ether (TMPDE), tripropylene glycol diacrylate (TPGDA), pentaerythritol triacrylate (PETA), ethylene glycol dimethacrylate (EGDA), triethylopropane trimethacrylate (TMPTMA), 2-phenoxyethyl acrylate (2-PEA), trimethylolpropane ethoxylate triacrylate (TMPEOTA), tetrahydrofurfuryl acrylate (THFA), and urethane diacrylate, aromatic-based: styrene (ST) and divinyl benzene (DVB), acrylonitrile-based (AN-based): acrylonitrile (AN), chloride-based (Cl-based): vinylidene chloride (VDC) and vinylbenzyl chloride (VBC), and others: vinyl stearate (VS) and vinyl propionate (VP).

8. The encapsulation material of claim 1, wherein the hydrophobic fluid includes at least one material selected from an amorphous fluoropolymer, a liquid containing fluorine, halocarbon oil, polyphenyl-methyl siloxane containing siloxane groups, polydiphenyl siloxane, polydimethyl siloxane, silicone oil, paraffin oil, mineral oil, almond oil, corn oil, cottonseed oil, linseed oil, tung oil, castor oil, cinnamon oil or coconut oil, an amorphous fluorine-based fluid such as tetrafluoroethylene, trifluoroethylene, difluoroethylene, 2,2-bisfluoromethyl-4,5-difluoro-1,3-dixole, or chlorotrifluoroethylene, an isoparaffinic hydrocarbon solvent, and a liquid crystal having a C3 or higher alkyl chain.

9. The encapsulation material of claim 1, wherein the photoinitiator includes at least one material selected from benzophenone, 1-hydroxy-cyclohexyl-pentyl-ketone (Irgacure 907), JR Cure, 2-methyl-1 [4-(methylthio)phenyl]-2-morpholinopropane-1-one (Irgacure 184C), 2-hydroxy-2-methyl-1-phenyl-propane-1-one (Darocur 1173), an initiator (Irgacure 500) in which 50 wt % of Irgacure 184C and 50 wt % of benzophenone are mixed, an initiator (Irgacure 1000) in which 20 wt % of Irgacure 184 and 80 wt % of Iragacure 1173 are mixed, 2-hydroxy-1-[4-(2-hydroxyethoxy)phenyl]-2-methyl-1-propanone (Irgacure 2959), methylbenzoylformate (Darocur MBF), alpha, alpha-dimethoxy-alpha-phenylacetophenone (Irgacure 651), 2-benzyl-2-(dimethylamino)-1-[4-(4-morpholinyl)phenyl]-1-butanone (Irgacure 369), an initiator (Irgacure 1300) in which 30 wt % of Irgacure 369 and 70 wt % of Iragacure 651 are mixed, diphenyl(2,4,6-trimethylbenzoyl)-phosphine oxide (Darocur TPO), an initiator (Darocur 4265) in which 50 wt % of Darocur TPO and 50 wt % of Darocur 1173 are mixed, phosphine oxide, phenyl bis(2,4,6,-trimethyl benzoyl) (Irgacure 819), 2-hydroxy-2-methyl-1-phenyl-propane-1-one (Darocur 1173), an initiator (Irgacure 2005) in which 5 wt % of Irgacure 819 and 95 wt % of Darocur 1173 are mixed, an initiator (Irgacure 2010) in which 10 wt % of Irgacure 819 and 90 wt % of Darocur 1173 are mixed, an initiator (Irgacure 2020) in which 20 wt % of Irgacure 819 and 80 wt % of Darocur 1173 are mixed, bis(.eta.5-2,4,-cyclopetadien-1-yl)bis [2,6-difluoro-3-(1H-pyrrol-1-yl)phenyl]titanium (Irgacure 784), a benzophenone-containing mixed initiator (HSP 188), 1-hydroxy-cyclohexylphenyl-ketone (CPA), and 2,4,6,-trimethylbenzoyl-diphenyl-phosphineoxide (Darocur TPO).

10. The encapsulation material of claim 1, wherein the photocuring of the encapsulation material is performed using light having a wavelength of 250 to 400 nm.

11. A light-emitting device comprising:
a light-emitting element formed on a transparent substrate; and
an encapsulation formed by applying the light-emitting element encapsulation material described in claim 1 to the light-emitting element and photocuring.

12. The light-emitting device of claim 11, wherein the encapsulation is formed by applying the light emitting element encapsulation material to the light-emitting element by one of a spin coating method, a bar coating method, a spreading coating method, and a simple immersion method, and then photocuring.

13. The light-emitting device of claim 11, wherein the encapsulation is applied by applying the light-emitting element encapsulation material to a medium and photocuring and then adhering the medium to the light-emitting element.

14. The light-emitting device of claim 11, further comprising a barrier layer adhered to the encapsulation.

15. The light-emitting device of claim 14, wherein the barrier layer includes one of a thin glass, a film in which a polymer and an inorganic material are stacked, and a multilayer film of inorganic films.

16. The light-emitting device of claim 11, further comprising a moisture absorbing layer formed on the encapsulation.

17. The light-emitting device of claim 11, wherein the light-emitting element is an organic light-emitting diode (OLED).

* * * * *